Sept. 21, 1971 J. M. SCHROEDER 3,606,679

METHOD FOR INTERCONNECTING SOLID STATE DEVICES SUCH AS INTEGRATED CIRCUIT CHIPS

Filed Oct. 29, 1969

JON M. SCHROEDER
INVENTOR.

BY Alan H. MacPherson
Stuart Lubitz
ATTORNEY

United States Patent Office 3,606,679

Patented Sept. 21, 1971

3,606,679

METHOD FOR INTERCONNECTING SOLID STATE DEVICES SUCH AS INTEGRATED CIRCUIT CHIPS

Jon M. Schroeder, Los Altos, Calif., assignor to Fairchild Camera and Instrument Corporation, Syosset, N.Y.

Filed Oct. 29, 1969, Ser. No. 874,532

Int. Cl. G03c 5/04

U.S. Cl. 29—626 1 Claim

ABSTRACT OF THE DISCLOSURE

A method for interconnecting device chips such as integrated circuit chips on a substrate is disclosed. A photographic mask is made from a transparent sheet which is placed on a diagram of a circuit containing the chips. Templates representative of the device chips and strips representative of the interconnecting leads are imposed on the transparent sheet. Separate masks for the crossover leads and for forming holes in a dielectric to allow the connections between the crossover leads and the remainder of the circuit are formed from second and third transparent sheets. The masks made from these transparent sheets are utilized to form the interconnections in the circuit by photofabrication techniques.

BACKGROUND OF THE INVENTION

(1) Field of the invention

The invention relates to methods and processes for interconnecting integrated circuit chips and other solid state devices.

(2) Prior art

The cost of producing integrated circuit chips, hybrid circuits and other solid state devices has been greatly reduced in recent years. Yet the overall cost of producing large networks or circuits utilizing such devices has not been proportionately reduced. One reason for this is that the cost of interconnecting integrated circuit chips and other solid state devices in larger circuit is expensive, often requiring tedious manual operations. The art of interconnecting such devices has not kept pace with the semiconductor industries' ability to mass produce a seemingly endless line of solid state devices at low cost.

One common method of interconnecting integrated circuit chips is to have one or more chips wired to a plug-in circuit board. The board is then plugged into a socket and back plane wiring is utilized to interconnect the sockets. This method of utilizing integrated circuit chips is costly and time-consuming. Typically, the integrated circuits utilized on such a board represent only a small fraction of the total cost of the board.

What is needed to reduce the overall cost of circuits which utilize a plurality of integrated circuit chips or similar devices is an inexpensive and rapid method for interconnecting these chips. The method should utilize equipment and techniques already known and used by the semiconductor industry, such as photofabrication techniques.

SUMMARY OF THE INVENTION

A method for interconnecting device chips such as integrated circuit chips on a substrate to form a circuit containing a plurality of chips is described. A first transparent sheet is placed over an enlarged diagram of the circuit. Templates representative of each of the chips in the circuit are placed on the transparent sheet. Strips of tape representative of the coplanar interconnection in the circuit are placed on the sheet. A second transparent sheet is placed above on the sheet. The second transparent sheet is placed above the circuit diagram and strips representative of the leads which cross over the coplanar leads of the first transparent sheet are placed on the second sheet. On a third transparent sheet, areas are masked at a location where the strips representative of leads on the first and second sheets must interconnect in order to complete the circuit. Masks are made from the first, second and third transparent sheets utilizing photographic methods. The masks are utilized to form the interconnections between the chips on a substrate utilizing commonly known photofabrication techniques. The mask made from the third transparent sheet is utilized to form holes in a dielectric layer so that interconnections may be made between the coplanar and crossover leads in the circuit.

DETAILED DESCRIPTION OF THE INVENTION

Figure 1:
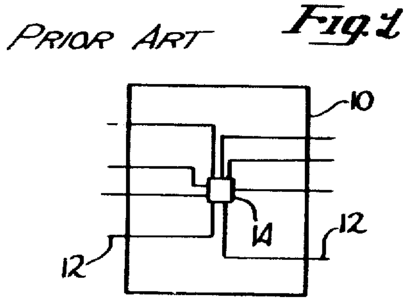
FIG. 1 illustrates a prior art method of interconnecting integrated circuit chips wherein a dual-in-line package is utilized.

A prior art method by which device chips such as integrated circuit chips, hybrid circuits or other solid state devices are interconnected is illustrated in FIG. 1. The schematically illustrated dual-in-line package of FIG. 1 illustrates as integrated circuit chip 14 mounted on a board or substrate 10 and coupled to leads 12 which are utilized to interconnect the chip 14 with other circuit elements. These leads are commonly coupled to the chip by ultrasonic or thermal compression bonds or by other well-known techniques. Other elements of the circuit are coupled to the ends of leads 12 by welding, soldering, wire wrapping or other well-known techniques. Typically, the cost of the integrated circuit chip 14 is relatively small when compared to the total cost of manufacturing the illustrated dual-in-line package and the cost of coupling the package with other circuit elements.

Figure 2:
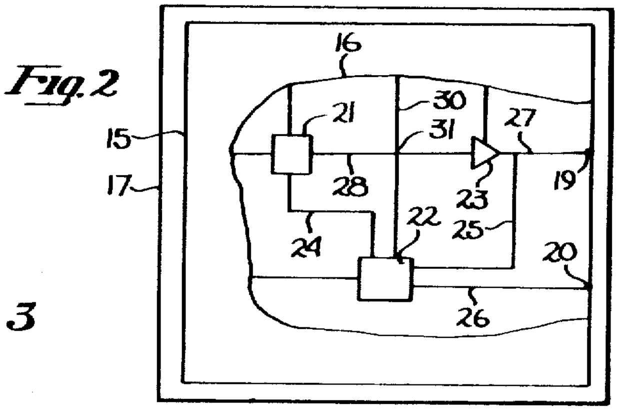
FIG. 2 illustrates an enlarged section of a circuit diagram.

Referring to FIG. 2, a section 16 of a circuit diagram contained on a sheet or drawing 15 is illustrated. The section of the circuit illustrated contains three integrated circuit chips 21, 22 and 23. Lead 28 couples chip 21 with 23 and lead 24 couples chip 21 with 22. Lead 25 couples chip 22 with lead 27. A lead 30 is also illustrated in FIG. 2 which is coupled to chip 22 and crosses over lead 28 at point 31. Two terminals 19 and 20 are illustrated in the section 16 of the circuit; lead 27 couples terminal 19 with chip 23 and lead 26 couples terminal 20 with chip 22.

The method described herein for interconnecting the integrated circuit chips 21, 22 and 23 of FIG. 2 is applicable to any circuit containing any number of device chips such as integrated circuit chips, multichip integrated circuits, hybrid circuits and other solid state devices. For the sake of clarity and convenience, the method will be described for the circuit shown within section 16 of FIG. 2. It will be obvious that the method described is applicable to any size circuit or network containing any number of device chips. In addition, the method described allows interconnections to be made between the device chips and between leads, conductors, terminals or other elements in the circuit.

The process for interconnecting a plurality of device chips in a circuit or network begins by superimposing a circuit diagram of the desired circuit on a transparent sheet 17 illustrated in FIG. 2. The superimposition of the circuit diagram on the transparent sheet 17 may be accomplished by placing sheet 17 on circuit diagram 15. It is, of course, within the scope of the present invention to utilize photographic techniques or other optical or electro-optical methods for superimposing the circuit diagram 15 on the transparent sheet 17. Sheet 17 may be a transparent sheet of glass, plastic or any other transparent material.

The circuit diagram 15, a section 16 of which is illustrated in FIG. 2, may be an enlarged circuit diagram when compared to the actual size of the desired circuit. It has been found that a circuit diagram which is approximately 10 times the size of the actual circuit is a convenient diagram to use for the method described herein. It is, of course, within the scope of the present invention to utilize a circuit diagram 15 wherein any scale is utilized to represent the circuit components and their interconnections.

Figure 3:
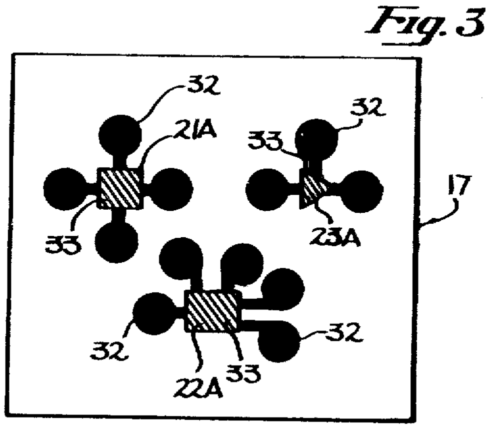
FIG. 3 illustrates templates representative of the intergrated circuit chips for the circuit of FIG. 2.

After sheet 17 has been placed over circuit diagram 15, templates representative (to scale) of the integrated circuit chips are imposed or placed on sheet 17 in the approximate location at which they appear in the circuit diagram 15. Referring to FIG. 3, template 21A representative of chip 21, template 22A representative of chip 22 and template 23A representative of chip 23, are illustrated imposed on sheet 17. The templates may be taped or glued to sheet 17 so that they remain fixed on the sheet during the rest of the method described herein.

Each of the templates illustrated on sheet 17 of FIG. 3 contain a section 33 which has a shape resembling that of the device chip such as the integrated circuit chip over which the template is placed. The sections 33, shown in cross-section lines, are transparent, thus allowing light to pass through the sections 33 and sheet 17. Each of the templates contains a plurality of opaque outer areas 32 which are coupled to the center area 33. The outer areas 32 are located about area 33 such that the leads or points of connection of the device chips fall within the areas 32.

The templates 21A, 22A and 23A may be made from transparent plastic or glass having the areas 32 painted or silk screened so that those areas are opaque. Each of the templates should be the same size and shape as the device chip it represents when compared with the diagram 15 of FIG. 2. For example, if the circuit illustrated in diagram 15 is approximately 10 times the actual size of the circuit, each of the areas 33 of the templates would be approximately 10 times the actual size of the device chips which they represent. The size and shape of the areas 32 are not critical but these areas should be of a size and shape to allow the leads or connections associated with the chips to readily fall within the area 32.

Figure 4:
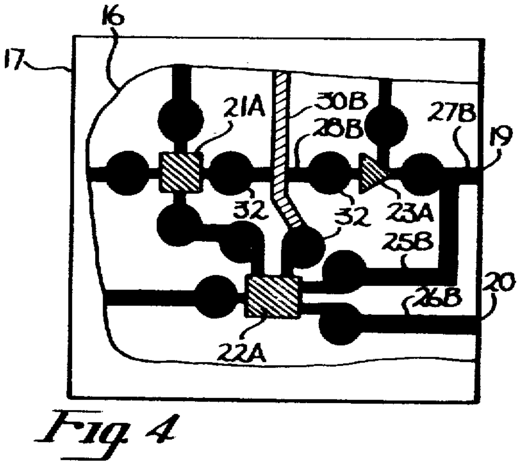
FIG. 4 illustrates the templates of FIG. 3 and strips of tape placed on a transparent sheet which are representative of the integrated circuit chips and interconnecting leads of the circuit illustrated in FIG. 2.

After the templates representative of each of the chips in the circuit have been placed on transparent sheets 17, masking strips representative of the interconnections such as conductors or leads in the circuit are placed on the sheet 17 above the appearance in the circuit diagram as is indicated in FIG. 4. These masking strips may be ordinary strips of tape that are opaque. Referring to FIGS. 2 and 4, lead 28 of FIG. 2 is illustrated as strip 28B in FIG. 4. Strip 28B interconnects an area 32 of template 21A with an area 32 of template 23A. In the same manner, strip 27B connects terminal 19 with template 23A and strip 26B connects terminal 20 with template 22A.

The interconnections of the section of circuit 16 which are not coplanar, that is, those leads which cross other leads, are represented on sheet 17 with strips of a different color than those of the coplanar leads. For example, referring to FIG. 2, lead 30 crosses lead 28 at point 31. In FIG. 4, a different color tape or strip 30B is placed on sheet 17 to interconnect template 22A with the remainder of a circuit. It will be obvious to one skilled in the art that in a large circuit, numerous leads will cross other leads, thus a plurality of strips similar to strip 30B will be present on the first transparent sheet.

Figure 5:
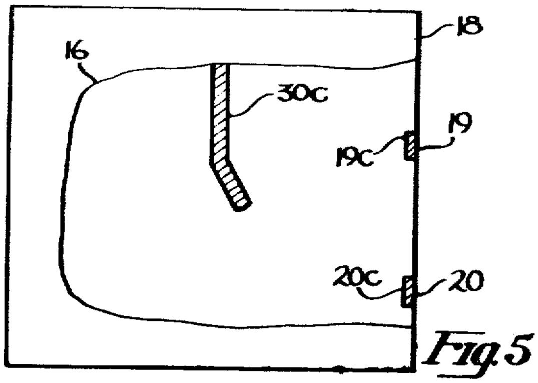
FIG. 5 illustrates strips on a second transparent sheet which are representative of the crossover leads and terminals for the circuit illustrated in FIG. 2.

After the strips of tape representative of the interconnections in the circuit have been placed on the sheet 17, a second transparent sheet 18, which may be similar to sheet 17 is placed over sheet 17. Those strips such as strip 30B which cross over the coplanar leads of the circuit are masked or taped on the second transparent sheet 18 as is illustrated in FIG. 5. For example, opaque strip 30C is taped on sheet 18 above strip 30B. In a large circuit, a plurality of opaque strips similar to strip 30C will appear on sheet 18. In addition to the crossover lead 30C which is masked on sheet 18, pieces of opaque tape representative of the location of terminals 19 and 20 may be also placed on sheet 18 as illustrated by areas 19C and 20C in FIG. 5. As will be seen later, these areas allow a convenient method for obtaining terminal connections when the circuit is completed. Strip 30C and the tape utilized for areas 19C and 20C, may be similar to the tape utilized to represent the coplanar leads of the circuit on sheet 17 and hence, may be opaque tape. Once the crossover leads have been placed on sheet 18, the strips representative of the crossover leads originally placed on sheet 17 are removed. For example, the strip 30B, illustrated in FIG. 4, is removed from sheet 17.

Figure 7:
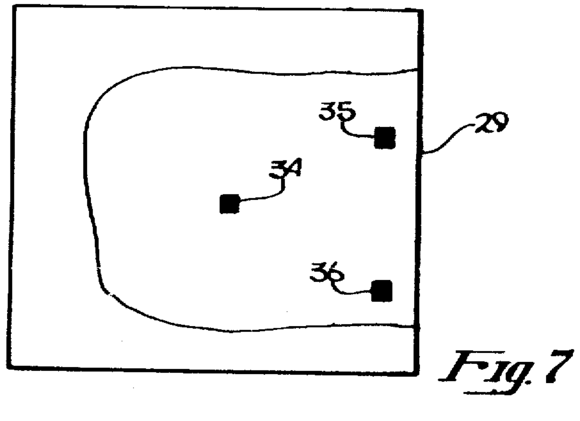
FIG. 7 illustrates a third transparent sheet upon which opaque areas have been made to indicate the locations at which interconnections must be made between the leads represented by strips on the first and second transparent sheets in order to complete the circuit illustrated in FIG. 2.

After the crossover leads have been removed from the first transparent sheet, a third transparent sheet which may be similar to sheets 17 and 18, is superimposed over the first and second transparent sheets. For example, sheet 29, shown in FIG. 7, may be placed above those areas at which electrical connections must be made between the conductors or leads represented by strips on the first transparent sheet 17 and the second transparent sheet 18 in order that the electrical circuit illustrated in FIG. 2 may be completed. This third sheet 29 is eventually used to produce a mask which is used to form holes in a dielectric layer so that electrical connections may be made between the leads represented on sheet 17 with those on sheet 18. In the present example, strip 30C of sheet 18, illustrated in FIG. 5, must make electrical contact with an area 32 of template 22A (FIG. 4). Thus, on sheet 29, area 34 is masked with tape or paint such that area 34 is coincident with the end of strip 30C of FIG. 5 and an area 32 illustrated in FIG. 4 as part of template 22A. Two other areas are also masked on sheet 29 illustrated as areas 35 and 36. Area 35 will be subsequently used so that the terminal represented by area 19C of FIG. 5 may be coupled to the lead represented by strip 27B of FIG. 4. Likewise, area 36 will be utilized to couple the terminal represented by area 20C of FIG. 5 with the lead represented by strip **26*b*** of FIG. 4.

Figure 6:
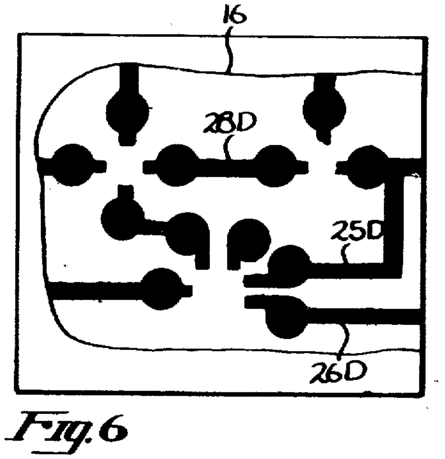
FIG. 6 illustrates a portion of a mask made from the transparent sheet illustrated in FIG. 4.

After the masking is completed on the third transparent sheet 29, masks are made from the three transparent sheets 17, 18 and 29. These masks may be made by commonly known techniques, such as photographic techniques, which are presently used in the semiconductor industry. During the process of forming the masks, a reduction in size may be made so that the mask produced from each of the transparent sheets is of a size equal to that of the actual circuit. One such mask made from the first transparent sheet 17 is illustrated in FIG. 6. The various strips representative of interconnections in the circuit placed on sheet 17, as illustrated in FIG. 4, again appear in the mask illustrated in FIG. 6. For example, lead 28 of FIG. 2 which is represented by strip 28B on transparent sheet 17 in FIG. 4, is illustrated as area 28D in FIG. 6. Note that strip 30B, a crossover lead originally placed on sheet 17, does not appear on the mask made from the first transparent sheet 17, but, instead, will appear on the mask made from the second transparent sheet 18.

Once the three masks have been made from the first, second and third transparent sheets, the circuit may be constructed on a substrate using commonly known photofabrication techniques. For example, the cross over leads or conductors may be first formed on an alumina ceramic substrate using the mask made on the second transparent sheet 18. These leads may be produced by evaporating or screening conductive metal such as aluminum, tungsten or molybdenum and utilizing photoresist and etching techniques in combination with a mask to remove undesired metal and for the conductive pattern. Following this, a dielectric layer may be deposited over these leads and holes may be formed in the dielectric layer representative of the areas 34, 35 and 36 shown in FIG. 7 so that subsequent electrical contact may be made between the first layer of conductors and subsequent layers. Following the layer of dielectric, the conductors or leads shown on the mask in FIG. 6 may be formed on the dielectric layer by commonly known methods. Next, the chips 21, 22 and 23 illustrated in FIG. 2 may be placed on the conductors in the appropriate locations and coupled to the circuit by any one of the numerous processes such as by ultrasonically bonding beam leads of the chips to the various areas on the substrate. Leads may be coupled to terminals 19 and 20 allowing relatively easy connections to the circuit.

Thus, an inexpensive and rapid method for interconnecting device chips such as integrated circuit chips or hybrid circuit chips using photofabrication techniques has been disclosed. The preparation of the first, second and third transparent sheets may be readily accomplished utilizing plastic parts and tape. The placement of the template and tape on the sheets and their relative location is not critical since in a practical application, there will be a great deal of area in the circuit diagram between each of the chips.

The above described method has numerous advantages. It enables standard integrated circuits to be combined into large scale arrays. This facilitates high yields and mass productions. The circuits may be custom made with short turn-around and low cost for integrating the array and assembling. The interconnected lead length may be reduced.

I claim:

1. A method for forming multilayer interconnections on a substrate between device chips to form a circuit, comprising the steps of:

(a) superimposing a first transparent sheet on an enlarged diagram of said circuit;

(b) imposing on said first transparent sheet templates containing inner transparent portions representative of said device chips and outer opaque portions representing the areas on which the points of connection of the device chips to the first layer of leads fall;

(c) placing on said first transparent sheet, strips of opaque tape of a first color representative of the first layer of interconnections between devices in said circuit;

(d) placing on said first transparent sheet, strips of opaque tape of a second color representative of the second layer of interconnections in said circuit;

(e) placing a second transparent sheet over said first transparent sheet;

(f) placing on a second transparent sheet, strips of opaque tape representative of the second layer of interconnections in said circuit by placing said opaque tape on said second transparent sheet over the opaque tape of a second color on said first transparent tape;

(g) removing said opaque tape of a second color from said first transparent sheet;

(h) placing a third transparent sheet over said second transparent sheet;

(i) masking on said third transparent sheet, locations at which the leads represented by the strips of opaque tape on said first and second transparent sheets are to be interconnected by conductive material through holes in intervening insulation such that said circuit is completely interconnected;

(j) photographically producing first, second and third masks reduced in size relative to said transparent sheets, from said first, second and third transparent sheets, respectively;

(k) forming the interconnections in said circuit by photofabrication techniques utilizing the masks produced from said first, second and third transparent sheets, said second mask being used to define a first layer of conductive leads on a substrate, said first mask being used to define a second layer of conductive leads separated by insulation from said first layer of conductive leads, and said third mask being used to define holes in said insulation for containing conductive material to interconnect said first layer of leads to said second layer of leads; and (l) bonding semiconductor chips onto the leads in said second layer of conductive leads to form a circuit from said chips, said first layer of conductive leads, said second layer of conductive leads and said conductive material in said holes in said insulation.

References Cited

UNITED STATES PATENTS

| | | | |
|---|---|---|---|
| 2,610,413 | 9/1952 | Dasey | 96—43 |
| 2,752,245 | 6/1956 | Hough et al. | 96—43 |
| 2,972,533 | 2/1961 | Frankau et al. | 96—41X |
| 3,171,204 | 3/1965 | Balducci | 96—41X |
| 3,171,741 | 3/1965 | Meyer | 96—36.2 |
| 3,288,607 | 11/1966 | Middleton | 96—36.2X |
| 3,508,919 | 4/1970 | Reimer | 96—36.2 |

JOHN T. GOOLKASIAN, Primary Examiner

J. C. GIL, Assistant Examiner

U.S. Cl. X.R.

96—36.2, 41, 43